United States Patent

Swatton et al.

[11] Patent Number: 5,582,954
[45] Date of Patent: Dec. 10, 1996

[54] PROCESS FOR PREPARING PHOTOHARDENABLE ELASTOMERIC ELEMENT HAVING INCREASED EXPOSURE LATITUDE

[75] Inventors: David W. Swatton, N. Middletown; Bernard Feinberg, Englishtown, both of N.J.; Udo Weikart, Obernburg, Germany

[73] Assignee: E.I. Du Pont de Nemours and Company, Wilmington, Del.

[21] Appl. No.: 458,631

[22] Filed: Jun. 2, 1995

Related U.S. Application Data

[63] Continuation of Ser. No. 224,051, Apr. 7, 1994, abandoned, which is a continuation of Ser. No. 829,998, Jan. 31, 1992, abandoned.

[51] Int. Cl.$^6$ .................................................. G03C 1/73
[52] U.S. Cl. ................................. 430/281.1; 430/270.1; 430/280.1
[58] Field of Search ..................................... 430/281, 270, 430/280

[56] References Cited

U.S. PATENT DOCUMENTS

| | | | |
|---|---|---|---|
| 3,989,609 | 11/1976 | Brack | 522/33 X |
| 4,218,294 | 8/1980 | Brack | 522/33 X |
| 4,517,278 | 5/1985 | Sakurai | 430/286 |
| 4,686,172 | 8/1987 | Worns et al. | 430/286 |

FOREIGN PATENT DOCUMENTS

| | | |
|---|---|---|
| 4423358 | 8/1991 | European Pat. Off. . |

*Primary Examiner*—George F. Lesmes
*Assistant Examiner*—Laura Weiner

[57] ABSTRACT

A process for preparing a photohardenable elastomeric element having increased exposure latitude, said element having a support and a photohardenable layer wherein at least (a) a thermoplastic-elastomeric polymeric binder comprising a copolymer of isoprene, (b) a liquid plasticizer, and (c) a petroleum wax, are premixed is described.

15 Claims, No Drawings

PROCESS FOR PREPARING PHOTOHARDENABLE ELASTOMERIC ELEMENT HAVING INCREASED EXPOSURE LATITUDE

This is a continuation of application Ser. No. 08/224,051 filed Apr. 7, 1994, now abandoned, which is a continuation of application Ser. No. 07/829,998 filed Jan. 31, 1992, now abandoned.

FIELD OF THE INVENTION

This invention relates to a process for preparing a photohardenable elastomeric element which can be used to make a flexographic printing plate. More particularly, this invention relates to an improved process for preparing a photohardenable elastomeric element having an increased exposure latitude.

BACKGROUND OF THE INVENTION

Photohardenable elements have a support and a layer of photosensitive material, which is photopolymerizable or photocrosslinkable, applied thereon. Photohardenable elements can be used to prepare flexographic printing plates. Such elements generally comprise (1) an addition polymerizable nongaseous ethylenically unsaturated monomer, (2) a photoinitiating system activated by actinic radiation, and (3) an elastomeric or thermoplastic-elastomeric polymeric binder comprising polymerized conjugated diene monomers. Photohardenable compositions such as these frequently contain plasticizers to increase the softness and flexibility of the developed flexographic plates.

Processes for making photohardenable elements and producing flexographic printing plates therefrom are well known in the art. Photohardenable elements are typically prepared by mixing the monomer, the photoinitiator, and the binder, usually at an elevated temperature. A plasticizer is then added to the mixture and the resulting mixture is then formed into a sheet structure by several known methods such as solvent casting, hot pressing, calendering and extrusion. Generally, the mixture is formed into a sheet structure by using an extrusion and calendering process. Once the photopolymer composition is in the form of a sheet, the element can then be used to make a printing plate by first exposing the element imagewise to actinic radiation. The areas of the photohardenable layer which are exposed to the radiation are photopolymerized or photocrosslinked and thereby become less soluble in developer solvents. The unexposed or unpolymerized areas of the element are subsequently washed off using a suitable developer solvent. There can be additional post-development treatments such as detackification and post-exposure.

There are problems associated with making a photohardenable element using the above-described process. For example, it is often difficult to add plasticizer materials to the other components of the photopolymerizable composition if the plasticizer used is a highly viscous material. The plasticizer cannot be added directly to the other components prior to mixing because it causes agglomeration of the solid materials. Similarly, when the plasticizer is added after mixing has begun, as in a later stage of an extruder, it is difficult to pump the plasticizer from its drum into the mixing unit. Residual plasticizer remaining in the drum also presents a disposal problem. Thus, for environmental reasons, as well as ease of operation, an alternative process is needed.

European patent application EP 0 442 358, published Aug. 21, 1991 describes a process in which the liquid constituents of the photohardenable mixture are premixed with the elastomeric binder, which is granular, until they are absorbed by the binder. The mixture is then dusted with a powder which is not soluble in the liquids. This process is disadvantageous because an additional powdered material is introduced into the photohardenable composition. Such powdered material adds dust, is difficult to handle, and may adversely impact the properties of the composition.

There are also problems associated with the process to prepare the flexographic printing plate from the photohardenable element. For example, when exposing the element imagewise to actinic radiation, it is frequently difficult to obtain the proper exposure time. The exposure time must be long enough to polymerize small areas, i.e., the highlight dots, so that these areas are not washed away with the developer solvent. At the same time, the exposure time must not be too long or fine lines, which are intended to remain unexposed and be washed out, i.e., the reverse lines, will polymerize and not wash out. In either case, if the exposure is too short or too long, the resolution and detail of the final plate is inadequate. It is particularly difficult to obtain the proper exposure with plates in which the elastomeric binder is a copolymer of isoprene, e.g., a styrene-isoprene-styrene block copolymer. It has been found that the photoactivity is greater and the exposure latitude even lower in flexographic plates containing these binders.

It is therefore desirable to have a process for preparing photohardenable elastomeric elements and flexographic printing plates which overcomes the above-described disadvantages.

SUMMARY OF THE INVENTION

The present invention provides a process for preparing a photohardenable elastomeric element having a support and a photohardenable layer which comprises:

(A) premixing at least (a) a thermoplastic-elastomeric polymeric binder comprising a copolymer of isoprene, (b) a liquid plasticizer and (c) a petroleum wax to form a first mixture;

(B) optionally mixing (d) a photoinitiating system activated by actinic radiation and/or (e) an addition polymerizable nongaseous ethylenically unsaturated monomer, to form a second mixture;

(C) mixing the first and second mixtures to form a photohardenable mixture; and (D) forming the photohardenable mixture into a sheet structure onto a support;

wherein if either the (e) monomer or (d) photoinitiator is not added in step (B), it is added in Step (A); and wherein if the (d) photoinitiator and (e) monomer are not added in step (B) they both are added in Step (A).

In a preferred embodiment of this invention, the first mixture, i.e. the premixture, is formed into pellets after step (A). The pellets are then mixed with any optional remaining components, such as the monomer and/or photoinitiator, to obtain a photohardenable mixture which is then formed into a sheet structure by an extrusion process and further calendered between the support and a multilayer cover element. The multilayer cover element consists essentially of a flexible cover film, a layer of an elastomeric composition and, optionally, a flexible polymeric film. The elastomeric layer comprises an elastomeric polymeric binder, a second polymeric binder and, optionally, a nonmigratory dye or pigment.

DETAILED DESCRIPTION OF THE INVENTION

Surprisingly and unexpectedly, it has been found that a photohardenable elastomeric element having increased exposure latitude can be obtained by (a) premixing at least a liquid plasticizer, a thermoplastic-elastomeric polymeric binder and a petroleum wax to form a homogeneous premixture; (b) mixing the premixture a second time to form a photohardenable mixture and (c) forming the photohardenable mixture into a sheet structure on a support.

The first step in the process of the invention is the premixing of at least three components until a homogeneous mixture is obtained. By the term "premixing" it is meant that the components are mixed a first time to form a homogeneous mixture. This premixing step is in addition to the mixing that takes place prior to the step in which the photohardenable mixture is formed into a sheet structure. The three components which are premixed are the binder, the plasticizer and the petroleum wax.

The premixing of the binder, plasticizer and petroleum wax, can take place in any conventional mixing apparatus, including plough blade mixers, ribbon mixers, paddle mixers, tumbling mixers and gravity mixers. A Banbury mixer or similar mixing device is particularly suitable. The premixing is carried out at a temperature slightly above room temperature, generally in the range of 50° to 200° C. depending on the nature of the materials. Preferably the temperature is in the range of 100° to 170° C. The binder, plasticizer, and wax are premixed for a time sufficient to provide an approximately homogeneous mixture. Usually a time of about 2 to 30 minutes is sufficient.

The binder used in the process of the invention is an elastomeric polymeric material comprising polymerized isoprene monomers. A preferred binder is a copolymer of styrene and isoprene, particularly a block copolymer of the A-B-A type, i.e., styrene-isoprene-styrene. Such binders are discussed in, e.g., Chen, U.S. Pat. No. 4,323,636. The binder used in the process of the invention is generally present in an amount of 50 to 90% by weight of the total photohardenable layer. It is preferred that the binder be present in at least an amount of 65% by weight of the total photohardenable layer.

The plasticizer used in the process of the invention is a material which is compatible with the binder and which increases the softness and flexibility of the photohardenable layer and resulting flexographic plate. The plasticizer must be compatible with the binder to the extent that a clear, non-cloudy photohardenable layer is produced. Examples of suitable plasticizers include process oils including aromatic, naphthenic and paraffinic compounds, e.g., the Shellflex materials from Shell Chemical Co. (Houston, Tex.), the Tufflo materials from Atlantic Richfield Co; the Polypropene materials from Amoco Chemical Corp.; and low molecular weight diene polymers such as butadiene or isoprene polymers, e.g., the Polybutene materials from Chevron Chemical Co. and Polyoil from Nudex, Inc. (Piscataway, N.J.). A preferred plasticizer is liquid polyisoprene; particularly preferred is polyisoprene having a molecular weight in the range of 25,000 to 50,000.

The plasticizer should be present in an amount which is sufficient to impart softness and flexibility to the developed printing relief, without causing a deleterious effect on the other properties of the photohardenable element. Generally, the amount of plasticizer is in the range of about 1 to 30%, preferably 5 to 15%, based on the weight of the photohardenable layer.

The petroleum wax is added to prevent the premixture from being excessively sticky or breaking up into agglomerates. This is particularly important when the premixture is to be formed into small units, such as pellets. Suitable waxes are tasteless and odorless solids consisting of a mixture of solid hydrocarbons. Both paraffin waxes and microcrystalline waxes can be used. Microcrystalline waxes are preferred as they tend to form more physically stable mixes. A particularly preferred wax is Ceresin wax. The petroleum wax is generally present in an amount of about 0.5 to 5.0%, based on the weight of the photohardenable layer.

It is preferred that the premixture also contain an aromatic resin. The aromatic resin is generally added to improve the extrudability of the photohardenable layer. When the binder is a block copolymer of isoprene and an aromatic hydrocarbon, e.g., styrene-isoprene-styrene, the aromatic resin is compatible predominantly with the aromatic segment. The aromatic resin is generally a polymeric material having a high solubility parameter and a softening point above about 85° C. Examples of suitable resins include alkylated aromatic polyindene resins, coumarone-indene resins, low molecular weight polystyrene, polymers and copolymers of alpha-methylstyrene. A preferred resin is a copolymer of alpha-methylstyrene and vinyltoluene. The aromatic resin is generally present in an amount of 1 to 15% by weight of the total photohardenable layer.

Although not preferred, it is possible to have the premixture contain all of the components in the photohardenable composition. In this embodiment, all of the components in the photohardenable composition, i.e., the binder, the plasticizer, the petroleum wax, the monomer, the photoinitiator and suitable additives, are premixed in a first mixing step and then mixed again prior to formation into a sheet structure. The additional components in the photohardenable composition, i.e., the monomer, photoinitiating system, and additives, will be discussed in greater detail below.

In a preferred embodiment, the premixture is divided into small units prior to the second mixing step. This is done mainly to aid in the handling of the premixture. The small units can be in the shape of a sphere, cube, pellet, string, or filament, etc, or they can be irregular in shape. The formation of the premixture into small units can be accomplished, for example, by chopping the premixture into pieces, or by placing the premixture into an extruder and extruding the mixture through a die plate with the appropriately shaped openings. The small units can be of almost any size which facilitates handling.

In a particularly preferred embodiment, the premixture is formed into pellets having a size in the range of about 0.3 to about 0.8 cm in diameter. It is preferred that this be accomplished by feeding the molten premixture into a single-screw extruder and extruding the mixture through a die plate with holes approximately 0.25 to 0.5 cm in diameter. The extruded material is then chopped into pellets approximately 0.3 to 1.0 cm long by a rotating knife on the die plate. The pellets are then carried away by a stream of water. The water can contain a small amount, about 0.1 to 10% by weight, of a dispersing agent to prevent agglomeration of the pellets. Suitable dispersing agents include quaternary ammonium compounds, sulfonated oils, polyhydric alcohol ester and ethers, and salts or esters of acids such as oleic, lauric or stearic acid. A preferred dispersing agent is calcium stearate.

The next step is to mix again the premixture, as formed or divided into small units. It is at this point that all the remaining components of the photohardenable composition are added. It is preferred that at least the monomer be added separately to the premixture in this step. It is preferred that the mixture be made by forming the composition into a hot melt. This can be accomplished by placing the components in a mixing device such as a rubber mill, which may be part of a calender device. The melting and mixing can also be carried out in the first stages of the extruder which also performs the functions of deaerating and filtering the composition. Although any order of addition can be used, it is preferred to first place the premixture in the mixing device or extruder. The monomer, initiator or other additives are subsequently added to the premixture. A suitable extruder is a twin screw extruder, although other known commercial extruders can be used. The temperature of the melt in the extruder is within the range of about 130° to 200° C., and the composition remains in the extruder from about 1 to 5 minutes.

Monomers which are suitable in the photohardenable composition are addition-polymerizable ethylenically unsaturated compounds. The photohardenable material can contain a single monomer or a mixture of monomers which must be compatible with the binder to the extent that a clear, non-cloudy photohardenable layer is produced. Monomers that can be used are well know in the art. Examples of such monomers can be found in Chen, U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315. Preferred monomers include the acrylate and methacrylate mono- and poly-esters of alcohols and polyols such as alkyl alcohols, hexamethylene glycol, trimethylol propane, polyoxypropyltrimethylol propane, pentaerythritol, dipentaerythritol and the like. It is preferred that the monomer be present in at least an amount of 5% by weight of the photohardenable layer.

The photoinitiating system can be any organic compound or group of compounds which is radiation sensitive, free-radical generating, and which initiates polymerization of the monomer or monomers without excessive termination. It should be activatable by actinic radiation and thermally inactive at and below 185° C. Photoinitiating systems of this type include the substituted and unsubstituted polynuclear quinones, aromatic ketones, benzoin and benzoin ethers, and 2,4,5-triarylimidazolyl dimers. Examples of suitable systems have been disclosed in Gruetzmacher et al., U.S. Pat. No. 4,460,675 and Feinberg et al., U.S. Pat. No. 4,894,315. Initiator systems are present in amounts from about 0.001% to 10% based on the weight of the photohardenable composition.

The photohardenable composition can also contain other additives depending on the final properties desired. Such additives include thermal polymerization inhibitors, antioxidants, antiozonants, colorants, fillers or reinforcing agents. These can be added to the components which are combined to form the premixture in step (A), or they can be added when the premixture is mixed to form the photohardenable mixture in steps (B) and (C). In general, most fillers and reinforcing agents will be added to the first components. All other ingredients will be added in step (B).

The final step in the process of the invention is the formation of the above photohardenable material, i.e., the mixture of the premixture and the optional remaining components, into a sheet structure on a support. The photohardenable material can be formed into sheets or layers by several known methods such as solvent casting, hot pressing, calendering and extrusion. It is preferred that the photohardenable material be extruded through a die slot directly onto the support and treated to achieve the desired thickness. It is preferred that this be accomplished by calendering the photohardenable material between two sheets or films such as the support and a cover layer. Alternatively, the calendering of the photohardenable material can occur between two temporary supports. Calendering is accomplished by passing the photohardenable material from the mixing device or extruder into the nip of a calender and calendering while hot between the support and a cover layer.

Alternatively, the photohardenable material can be placed between the support and a cover layer in a mold. The material is then pressed flat by the application of heat and/or pressure.

Materials suitable for the support include metals, e.g., steel and aluminum plates, sheets and foils, films or plates composed of various film-forming synthetic resins or polymers, such as the addition polymers and linear condensation polymers. Preferred support materials are polyester films, such as polyethylene terephthalate.

A transparent cover sheet such as a thin film of polystyrene, polyethylene, polypropylene or other strippable material can be used as a cover element to prevent contamination of or damage to the photohardenable layer during storage or manipulation. The cover sheet can also include a thin, hard, flexible solvent-soluble layer, e.g., a polyamide layer, or a copolymer of polyethylene and polyvinyl acetate, etc. This can be placed on the upper surface of the photohardenable layer to protect for reuse the image-bearing negative or transparency superposed thereon, or to improve contact or alignment with the photohardenable surface.

In practicing the process of the invention, it is preferred to calender the photohardenable material, between a support and a multilayer cover element wherein said multilayer cover element consists essentially of a flexible cover film, optionally a flexible polymeric film, and a layer of an elastomeric composition which is photohardenable or becomes photohardenable by contact with the photohardenable layer. Such multilayer cover elements are disclosed in Gruetzmacher et al., U.S. Pat. Nos. 4,427,759 and 4,460,675. The flexible cover film, which can be subcoated, is generally a polyester, polystyrene, polyethylene, polypropylene or other strippable film. The optional flexible polymeric film layer is present adjacent to the cover film. This layer is soluble or strippable in developer solutions during processing of the exposed element, and can have the same composition as the solvent-soluble layer discussed above. The optional flexible polymeric film is preferably a polyamide or a copolymer of ethylene and vinyl acetate.

The elastomeric layer of the multilayer cover element should have an elastic modulus in the polymerized state not substantially less than the elastic modulus of the photohardenable layer in the exposed state. The elastomeric composition comprises an elastomeric polymeric binder, a second polymeric binder and optionally a nonmigratory dye or pigment. The elastomeric composition can also contain a monomer or monomers and a photoinitiating system. The elastomeric polymeric binder in the elastomeric composition is generally the same as or similar to the elastomeric binder present in the photohardenable layer.

In general, the process of preparing a flexographic printing plate from a photohardenable element includes the steps of (1) main imagewise exposure, (2) development or washout, and (3) post-development treatment. Post-development treatment can include any or all of the following: drying, overall post-exposure and surface detackification. A backflash exposure may also be used with elements having a transparent or translucent support. The backflash exposure step is carried out before the main imagewise exposure step and gives the photohardenable layer a uniform and relatively short exposure through the support, thereby photocrosslinking the binder and monomer in the support region, i.e., creating a "floor". This serves to sensitize the plate and establishes the depth of the plate relief. The backflash exposure step generally uses a radiation source the same as or similar to that used for the main imagewise exposure, as discussed below.

Printing reliefs can be made from the photohardenable elements described above, by exposing to actinic radiation selected portions of the photohardenable layer through an image-bearing transparency. The image-bearing transparency can be constructed of any suitable material including cellulose acetate film and oriented polyester film. Upon exposure to actinic radiation, the ethylenically unsaturated monomer is polymerized or crosslinked in those areas of the photohardenable layer exposed to actinic radiation resulting in reduced solubility or swellability in developer solvents. No significant polymerization or crosslinking occurs in the unexposed areas of the photohardenable layer. Consequently, upon application of a suitable developer solvent, the exposed areas remain and the unexposed areas are removed from the photohardenable layer.

Actinic radiation from any source and of any type can be used in the process of the invention. The free-radical generating systems activatable by actinic radiation generally exhibit their maximum sensitivity in the ultraviolet range, therefore, the radiation source should furnish an effective amount of this radiation, preferably having a wavelength range between about 250 nm and 500 nm. In addition to sunlight, suitable radiation sources include carbon arcs, mercury-vapor arcs, fluorescent lamps, lasers, electron flash units and photographic flood lamps. Mercury-vapor lamps, and particularly sun lamps, are most suitable. A standard radiation source is the Sylvania 350 Blacklight fluorescent lamp (FR 48T12/350 VL/VHO/180, 115 w) which has a central wavelength of emission around 354 nm.

The radiation exposure time can vary from fractions of a second to minutes, depending upon the intensity and spectral energy distribution of the radiation, its distance from the photohardenable element, and the nature and amount of the photohardenable composition. The exposure latitude is the difference between the maximum and minimum exposure times needed to produce acceptable relief images. The maximum exposure time is usually determined as the maximum time for which the reverse lines are not filled in, i.e., fine lines which are intended to be washed out are actually washed out. The minimum exposure time is usually determined as the time necessary to hold the highlight dots. In other words, it is the minimum time needed for the small (2%) dots to remain polymerized and not wash out. The photohardenable elements made according to the process of the invention, have a substantially increased exposure latitude and thus allows the artisan greater flexibility during the plate making process.

The exposure is typically carried out using a mercury vapor arc or a sunlamp at a distance of about 1.5 to about 60 inches (3.8 to 153 cm) from the photohardenable element. Exposure temperatures are preferably ambient or slightly higher, i.e., about 20° to about 35° C.

Following imagewise exposure, the image can be developed by washing with a suitable developer. Solvent development is usually carried out at room temperature. Suitable developer solvents for the photohardenable element prepared according to the process of the invention include aromatic or aliphatic hydrocarbon or halohydrocarbon solvents. For example, acceptable solvents include perchloroethylene, 1,1,1-trichloroethane, tetrachloroethane, trichloroethylene, benzene, toluene, xylene, hexane, isononylacetate, methylisobutylketone, or mixtures of such solvents with suitable alcohols. Other organic solvent developers have been disclosed in published German Application No. 3828551.

Development time can vary, but it is preferably in the range of about 5 to 25 minutes. Developer can be applied in any convenient manner, including immersion, spraying and brush or roller application. Washout is frequently carried out in an automatic processing unit which uses solvent and mechanical brushing action to remove the unexposed portions of the plate, leaving a relief constituting the exposed image and floor.

Following solvent development, the relief printing plates are generally blotted or wiped dry, and then dried in a forced air or infrared oven. Drying times and temperature may vary, however, typically the plate is dried for about 60 to 120 minutes at 60° C. High temperatures are not recommended because the support can shrink and this can cause registration problems. Additional air drying overnight for 16 hours or more is common. The solvent will continue to evaporate from the printing relief during drying at ambient conditions.

After the plate has dried, most flexographic printing plates are given an overall exposure, or post-exposure, using the same radiation source as the main exposure step. Detackification is also an optional post-development treatment which can be applied if the surface is still tacky. Tackiness can be removed by methods well known in the art, such as treatment with bromine or chlorine solutions as described in Fickes et al., U.S. Pat. No. 4,400,460 or exposure to radiation sources having a wavelength not longer than 300 nm as described in European Patent Application EP 0 17 927.

The advantageous properties of this invention can be observed by reference to the following examples which illustrate, but do not limit, the practice of the invention.

EXAMPLES

In the following examples, all percentages are by weight unless other wise specified.

The following abbreviations are used:

Binder styrene-isoprene-styrene block copolymer; Kraton® 1107 from Shell Chemical Co., Houston, Tex.

PI liquid polyisoprene with a molecular weight of 29,000; LIR-30 Kuraray Chemical Co., Tokyo, Japan Piccotex copolymer of vinyl toluene and alpha-methyl styrene; Piccotex® 100S Hercules Co., Wilmington, Del.

Wax Ceresin wax

HMDA 1,6-hexanediol diacrylate

HMDMA 1,6-hexanediol dimethacrylate

Initiator 2-phenyl-2,2-dimethoxy acetophenone

Inhibitor 2,6-dimethyl-4-t-butyl phenol

HEMA hydroxyethyl methacrylate

Red Dye Neozapon® Red Dye from BASF Wyandotte Corp., Holland, Mich.

MABS tetrapolymer of methylmethacrylate/acrylonitrile/butadiene/styrene; Blendex® 491 from GE Specialty Chemicals, Parkersburg, W. Va.

Blue Dye Atlantic Fast Wool Blue® Dye from Atlantic Chemicals Co., Nutley, N.J.

Example 1

This example illustrates the premixing step of the process of the invention and the formation of pellets from the premixture.

The following ingredients were charged into a Banbury Mixer and blended at approximately 150° C.:

| Ingredient | Amount (parts by weight) |
|---|---|
| Binder | 83.2 |
| PI | 9.05 |
| Piccotex | 6.64 |
| Wax | 1.11 |

The molten polymer mass from the Banbury Mixer was fed into a single screw extruder, and then passed through a die plate having holes 3.175 mm in diameter. The polymer was then chopped into pellets approximately 0.5 cm long, by a rotating knife on the die plate. The pellets were carried away by a stream of water containing a small amount of calcium stearate to prevent agglomeration.

Example 2

This example illustrates the formation of a photohardenable element using the pelletized premixture from Example 1.

The following ingredients were added to a 92 mm twin screw extruder:

| Ingredient | Amount (parts by weight) |
|---|---|
| Pellets from Example 1 | 87.26 |
| HMDA | 5.09 |
| HMDMA | 3.57 |
| Initiator | 1.94 |
| Inhibitor | 1.92 |
| Red Dye | 0.0044 |
| HEMA | 0.173 |

The total composition contained 72.6 parts binder; 7.9 parts PI; 5.79 parts Piccotex; and 0.97 Wax.

The material was then extruded at about 174° C. and calendered between a support sheet of flame treated polyethylene terephthalate which was 5 mils (0.013 cm) thick and a multilayer cover element. The multilayer cover element was prepared by coating a 5 mil (0.013 cm) polyethylene terephthalate cover sheet with a first layer of Macromelt® 6900 polyamide (Henkel Corp., Minneapolis, Minn.) at a coating weight of 40 mg/dm$^2$; and a second 1.8 mil (0.0046 cm) thick layer of a blend at a coating weight of 480 mg/dm$^2$. The blend contained the following ingredients:

| Ingredient | Amount (parts by weight) |
|---|---|
| Binder | 66.7 |
| MABS | 31.5 |
| Blue Dye | 1.8 |

The total thickness of the plate, not including the polyethylene terephthalate cover sheet, was 107 mils (0.272 cm).

Comparative Example 1

In this example, a photohardenable element was prepared without premixing the binder, plasticizer and aromatic resin.

The same ingredients in the same proportion as in Example 2, but without premixing, were fed into a 92 mm twin screw extruder and extruded and calendered as described in Example 2. The total thickness, excluding the polyethylene terephthalate cover sheet, was 107 mils (0.272 cm).

Example 3

In this example, the exposure latitude was determined from photohardenable elements prepared according to the procedure described in Example 2 and Comparative Example 1.

A series of photohardenable elements prepared as described in Example 2 and Comparative Example 1 were exposed and developed using the same conditions. Each plate was exposed through the back (flame-treated polyester support) on a Cyrel® 30×40 exposure unit. Similarly, the front side of each plate was exposed through a phototool in the same exposure unit for times varying from 12 to 27 minutes in three minute steps. The exposed plate samples were washed for 5 minutes in a Cyrel® 30×40 rotary processor using tetrachloro-ethylene/n-butanol (75/25 volume percent) as the developing solvent. The sample plates were then dried in an oven at 60° C. for two hours. Following drying, the sample plates were detackified and post-exposed for 8 minutes in a Du Pont Cyrel® Light Finish/Post Exposure unit.

For each type of plate, the minimum exposure time to hold a 2% dot (120 line screen), i.e., not wash out the small dots, was determined. For each type of plate, the maximum exposure time for a 30 mil reverse line to remain unfilled to a depth of at least 100 micrometers, was also determined. The exposure latitude was determined as the difference between the minimum and maximum exposure times. The results given below, wherein time is measured in minutes, clearly show the superior exposure latitude of the plates made according to the process of the invention.

| Plate | Minimum Exposure | Maximum Exposure | Exposure Latitude |
|---|---|---|---|
| Example 2 | 12 | 25 | 13 |
| Comparative Ex. 1 | 12 | 16 | 4 |

The resolution and detail of Example 2 plates and Comparative Example 1 plates were the same when each was properly exposed.

We claim:

1. A process for preparing a photohardenable elastomeric element having a support and a photohardenable layer, said photohardenable layer comprising (a) a thermoplastic-elastomeric polymeric binder comprising a copolymer of isoprene, (b) a liquid plasticizer, (c) a petroleum wax, (d) a photoinitiating system and (e) an addition polymerizable nongaseous ethylenically unsaturated monomer, the process comprising:

(A) premixing the binder, the plasticizer and the wax to form a homogeneous first mixture;

(B) forming the first mixture into pellets by (i) feeding the first mixture into a single-screw extruder, (ii) extruding the first mixture through a die plate, (iii) chopping the extruded mixture to obtain pellets, and then (iv) applying a stream of water to the pellets;

(C) heating the pellets at a temperature in the range of 130° to 200° C. with mixing in an extruder and with the addition of the photoinitiating system and the monomer to form a second mixture; and (D) forming the second mixture into a sheet structure onto a support.

2. A process for preparing a photohardenable elastomeric element having a support and a photohardenable layer, said photohardenable layer comprising (a) a thermoplastic-elastomeric polymeric binder comprising a copolymer of isoprene, (b) a liquid plasticizer, (c) a petroleum wax, (d) a photoinitiating system and (e) an addition polymerizable nongaseous ethylenically unsaturated monomer, the process comprising:

(A) premixing the binder, the plasticizer, the wax and the photoinitiating system to form a homogeneous first mixture;

(B) forming the first mixture into pellets by (i) feeding the first mixture into a single-screw extruder, (ii) extruding the first mixture through a die plate, (iii) chopping the extruded mixture to obtain pellets, and then (iv) applying a stream of water to the pellets;

(C) heating the pellets at a temperature in the range of 130° to 200° C. with mixing in an extruder and with the addition of the monomer to form a second mixture; and (D) forming the second mixture into a sheet structure onto a support.

3. A process for preparing a photohardenable elastomeric element having a support and a photohardenable layer, said photohardenable layer comprising (a) a thermoplastic-elastomeric polymeric binder comprising a copolymer of isoprene, (b) a liquid plasticizer, (c) a petroleum wax, (d) a photoinitiating system and (e) an addition polymerizable nongaseous ethylenically unsaturated monomer, the process comprising:

(A) premixing the binder, the plasticizer, the wax and the monomer to form a homogeneous first mixture;

(B) forming the first mixture into pellets by (i) feeding the first mixture into a single-screw extruder, (ii) extruding the first mixture through a die plate, (iii) chopping the extruded mixture to obtain pellets, and then (iv) applying a stream of water to the pellets;

(C) heating the pellets at a temperature in the range of 130° to 200° C. with mixing in an extruder and with the addition of the photoinitiating system to form a second mixture; and (D) forming the second mixture into a sheet structure onto a support.

4. A process for preparing a photohardenable elastomeric element having a support and a photohardenable layer, said photohardenable layer comprising (a) a thermoplastic-elastomeric polymeric binder comprising a copolymer of isoprene, (b) a liquid plasticizer, (c) a petroleum was, (d) a photoinitiating system and (e) an addition polymerizable nongaseous ethylenically unsaturated monomer, the process comprising:

(A) premixing the binder, the plasticizer, the wax, the photoinitiating system and the monomer to form a homogeneous first mixture;

(B) forming the first mixture into pellets by (i) feeding the first mixture into a single-screw extruder, (ii) extruding the first mixture through a die plate, (iii) chopping the extruded mixture to obtain pellets, and then (iv) applying a stream of water to the pellets;

(C) heating the pellets at a temperature in the range of 130° to 200° C. with mixing in an extruder to form a second mixture; and (D) forming the second mixture into a sheet structure onto a support.

5. The process of claims 1, 2, 3, or 4 wherein the premixing in step (A) is carried out for about 2 to about 30 minutes to obtain an homogeneous mixture.

6. The process of claims 1, 2, 3, or 4 wherein the binder is styrene-isoprene-styrene.

7. The process of claims 1, 2, 3, or 4 wherein the plasticizer consists essentially of liquid polyisoprene.

8. The process of claims 1, 2, 3, or 4 wherein an aromatic resin is added to the first mixture formed in step (A) and is present in an amount of 1 to 15% by weight of the total photohardenable layer.

9. The process of claim 8 wherein the resin is a copolymer of alpha-methylstyrene and vinyltoluene.

10. The process of claims 1, 2, 3, or 4 wherein the stream of water contains a dispersing agent.

11. The process of claim 10 wherein the dispersing agent is calcium stearate.

12. The process of claims 1, 2, 3, or 4 wherein the pellets are formed into a sheet structure on a support by forming said pellets into a hot melt at a temperature of about 130° to 200° and then extruding and calendering the hot melt between a support and a multilayer-cover element.

13. The process of claims 1, 2, 3, or 4 wherein step (A) is carried out in a mixing device selected from the group consisting of plough blade mixers, ribbon mixers, paddle mixers, tumbling mixers, gravity mixers and Banbury mixers and step (B) is carried out in an extruder.

14. The process of claims 1, 2, 3, or 4 wherein step (A) is carried out at a temperature in the range of 100° to 170° C.

15. The process of claims 1, 2, 3, or 4 wherein the die plate has holes about 0.25 to 0.5 cm in diameter and the pellets have a size in the range of about 0.3 to about 1.0 cm in diameter.

* * * * *